United States Patent

Suzuki et al.

Patent Number: 5,920,811
Date of Patent: Jul. 6, 1999

[54] SUPERCONDUCTOR MIXER AND PHASE CONTROL METHOD THEREFOR

[75] Inventors: Katsumi Suzuki; Youichi Enomoto; Shoji Tanaka, all of Tokyo, Japan

[73] Assignees: International Superconductivity Technology Center; NEC Corporation, both of Tokyo, Japan

[21] Appl. No.: 08/876,244

[22] Filed: Jun. 16, 1997

[30] Foreign Application Priority Data

Jun. 14, 1996 [JP] Japan ..................... 8-154572

[51] Int. Cl.$^6$ ..................... H04B 1/26
[52] U.S. Cl. ..................... 455/323; 327/113; 505/202
[58] Field of Search ..................... 455/313, 318, 455/319, 323, 325, 327, 333; 327/113, 355, 356; 505/202, 210, 201

[56] References Cited

U.S. PATENT DOCUMENTS 5,493,719 2/1996 Smith et al. ..................... 455/333
5,790,078 8/1998 Suzuki et al. ..................... 505/201

OTHER PUBLICATIONS

J.H. Takemoto–Kobayashi et al., "Monolithic High–Tc Superconducting Phase Shifter at 10 GHz", *1992 IEEE MTT–S Digest*, 1992, pp. 469–472.

*Primary Examiner*—Nguyen Vo
*Attorney, Agent, or Firm*—Sughrue, Mion, Zinn, Macpeak & Seas, PLLC

[57] ABSTRACT

In a superconductor mixer, a non-linear element is provided on a substrate. The non-linear element comprises at least one Josephson junction connected in series. An antenna pattern of superconductor, an intermediate frequency output pattern of superconductor, and a bias current pattern of superconductor are connected to the non-linear element. A signal high frequency wave (RF) and a local reference frequency wave (LO) are received by the antenna pattern and then absorbed in the non-linear element to obtain an intermediate frequency (IF) signal. Then, with applying a current to the series connected Josephson junction in the non-linear element from the bias current pattern, the intermediate frequency (IF) signal as a frequency signal of a difference between the signal high frequency wave (RF) and the local reference frequency wave (LO) is output to the intermediate frequency output pattern. At this time, by varying the current supplied from the bias current pattern, a phase of the output intermediate frequency (IF) signal is varied.

8 Claims, 1 Drawing Sheet

BIAS CURRENT OF NON-LINEAR ELEMENT

SUPERCONDUCTOR MIXER AND PHASE CONTROL METHOD THEREFOR

BACKGROUND OF THE INVENTION

1. Field of the Invention

The present invention relates to a superconductor mixer and a phase control method therefor provided a non-linear element operative at a temperature of liquid nitrogen or lower, having a frequency converting function (mixer function) in a wide band frequency region and a phase control function, and thus is suitable for a phased-array antenna.

2. Description of the Prior Art

For promoting application of superconductor for electronic devices, high frequency response of the superconductor is quite important. There has been a demand for development of a superconductor mixer of higher frequency response and higher sensitivity. Conventionally, a superconductor mixer relatively easily performing mixer operation at a frequency near 100 GHz or higher has been practicable. On the other hand, as to phase control for the superconductor, separately from development of the mixer function, there has been developed a system which has an only function of phase control. For example, a phase control pattern, in which one signal line is separated into two signal lines having mutually different line lengths and then re-combine them, is considered. Means for blocking the signal propagating the signal line is provided on the separated signal lines. A phase is controlled by propagating a signal through the respective signal lines and blocking the signal propagating on one signal line.

On the other hand, as a phase control method, there is a method for controlling a phase by applying a current to several hundreds of reticular Josephson junction elements so that a current at respective Josephson junctions may be greater than or equal to the critical current for varying a reactance of the overall element (1992, IEEE MTT-S Digest 469–472).

In the conventional methods set forth above, the portion to block the signal or the several hundreds of Josephson junction elements are required to be formed on the same substrate. Formation of these is quite difficult. Also, since a portion performing mixer operation has to be formed on another portion, the superconductor mixer with the phase control function requires large area and is difficult to reduce the size.

On the other hand, as a prior art, there is a technology, in which a semiconductor of a variable resistance by irradiation of a light is arranged between two superconductive lines. In this technology, by adjusting a light to be irradiated on the semiconductor, a resistance of the semiconductor can be varied to selectively pass and block the signal between two superconductive lines. This method requires the semiconductor device arranged between two superconductive lines. Also, means for guiding the light to the semiconductor device is necessary. Therefore, the device cannot be formed only with superconductor. On the other hand, such a pattern does not has a frequency converting function, and thus requires the mixer to be formed independently in another portion.

SUMMARY OF THE INVENTION

An object of the present invention is to provide a compact superconductor mixer and a phase control method therefor, which comprises a plurality of non-linear elements, each having mixer function for converting a frequency and function for varying a phase of an intermediate frequency (IF) signal on the same substrate.

A superconductor mixer, according to the present invention, comprises a substrate, a thin film wiring of superconductor formed on the substrate and a non-linear element having at least one series connected Josephson junction and formed on the substrate. The thin film wiring includes an antenna pattern, an intermediate frequency output pattern and a phase control bias current supply pattern. The antenna pattern is connected to the non-linear element and discharges and absorbs a high frequency electromagnetic field. The intermediate frequency output pattern is connected to the non-linear element. The phase control bias current supply pattern is connected to the non-linear element and supplies a phase control current to the non-linear element.

Also, in the superconductor mixer, the series connected Josephson junction may be a SNS junction, in which one normal conductor is disposed between two superconductors.

Furthermore, in the superconductor mixer, a dimension of the non-linear element may be smaller than a quarter of an effective wavelength of the high frequency electromagnetic field.

In the semiconductor mixer, the thin film wiring may be consisted of at least one kind of oxide superconductor selected from a group consisted of YBaCuO compound and NdBaCuO compound.

Also, the non-linear element may be plural.

In a phase control method of the superconductor mixer as set forth above, according to the present invention, a signal high frequency wave (RF) and a local reference frequency wave (LO) are received by the antenna pattern. Then, the signal high frequency wave (RF) and the local reference frequency wave (LO) are absorbed in the non-linear element to obtain an intermediate frequency (IF) signal. Thereafter, the intermediate frequency (IF) signal is output as a frequency signal of difference between the signal high frequency wave (RF) and the local reference frequency wave (LO) to the intermediate frequency output pattern. Next, a phase of the intermediate frequency (IF) signal is varied by varying a current supplied from the phase control bias current supply pattern.

Also, in the phase control method for a superconductor mixer, variation of an amplitude of the intermediate frequency (IF) signal may be less than or equal to 1 dB.

Furthermore, in the control method for a superconductor mixer, an intensity of the local reference frequency wave (LO) may be varied, while the phase of the intermediate frequency (IF) signal is varied.

According to the present invention, since the non-linear element is connected to the thin film wiring pattern of superconductor, and the non-linear element comprises at least one series connected Josephson junction, the superconductor mixer having mixer function for converting the frequency and function for varying the phase of the intermediate frequency (IF) signal can be obtained. Therefore, it becomes unnecessary to provide several hundreds of reticular Josephson junction elements and to provide a high frequency switch used by the semiconductor or the like. Then, by varying the current supplied from the phase control bias current supply pattern, the phase of the intermediate frequency can be significantly varied with quite simple construction. Therefore, the superconductor mixed can be made compact.

On the other hand, since a superconductor non-linear element is used, the upper limit of the signal high frequency wave (RF) can be set at several hundreds GHz so as to permit designing of an antenna with applying the phase control element not depending upon the frequency. Thus, an electronic device can be formed into compact.

Furthermore, by providing a plurality of superconductor non-linear elements on the same substrate, the compact superconductor mixer of the same construction can be obtained.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
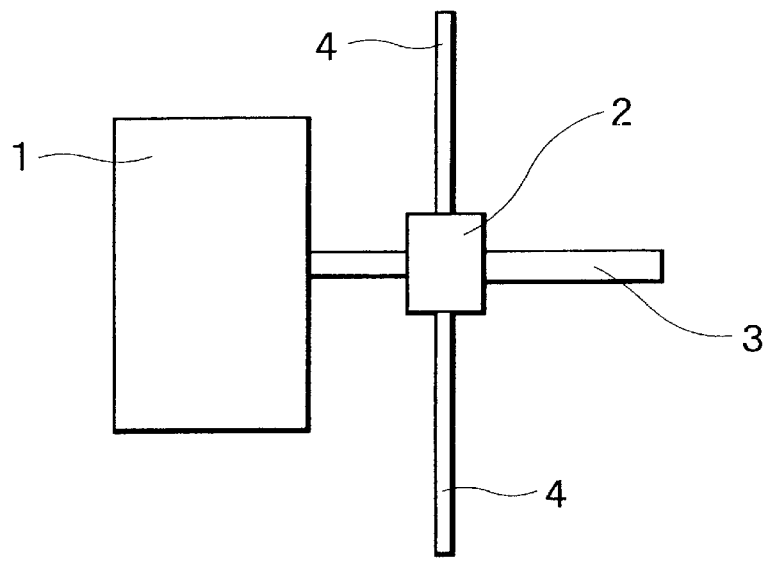
FIG. 1 is a diagrammatic illustration showing a preferred embodiment of a superconductor mixer according to the present invention.

FIG. 1 is a diagrammatic illustration of a preferred embodiment of a superconductor mixer according to the present invention. In the shown embodiment, a non-linear element 2 is provided on a substrate. The non-linear element 2 comprises at least one Josephson junction connected in series. An antenna pattern 1 of superconductor, an intermediate frequency output pattern 3 of superconductor, and a bias current pattern 4 of superconductor are connected to the non-linear element 2. Therefore, a superconductor mixer is formed.

It should be noted that the series connected Josephson junction forming the non-linear element 2 is a SNS junction, in which one normal conductor is disposed between two superconductors.

Also, a dimension of the non-linear element 2 is smaller than a quarter of effective wavelength of a signal high frequency wave (RF) and a local reference frequency wave (LO) as a high frequency electromagnetic field on the major surface of the substrate. When the dimension of the non-linear element 2 is smaller than a quarter of the effective wavelength, even when a plurality of series connected Josephson junctions are provided, each junction may operate at a uniform wave phase.

On the other hand, the thin film wiring of superconductor can be a wiring consisted of oxide superconductor of YBaCuO compound or NdBaCuO compound. Also, a plurality of non-linear elements 2 may be provided on the same substrate.

In the shown embodiment, first, the signal high frequency wave (RF) and the local reference frequency wave (LO) are received by the antenna pattern 1 and then absorbed in the non-linear element 2 to obtain an intermediate frequency (IF) signal. Then, with applying a current to the series connected Josephson junction in the non-linear element 2 from the bias current pattern 4, the intermediate frequency (IF) signal as a frequency signal of a difference between the signal high frequency wave (RF) and the local reference frequency wave (LO) is output to the intermediate frequency output pattern 3. At this time, by varying the current supplied from the bias current pattern 4, a phase of the output intermediate frequency (IF) signal is varied.

In the shown embodiment, the bias current pattern 4 is connected to the non-linear element 2, so by varying a current supplied from the bias current pattern 4, the phase of the intermediate frequency (IF) signal can be easily controlled with quite simple construction. Namely, the non-linear element 2 serves as frequency converting function and phase control function for the intermediate frequency (IF) signal. On the other hand, since a superconductive non-linear element is used, the upper limit of the frequency of the signal high frequency wave (RF) becomes several hundreds GHz. Therefore, an antenna can be designed without depending upon the operation frequency, and phase control can be done easily.

Figure 2:
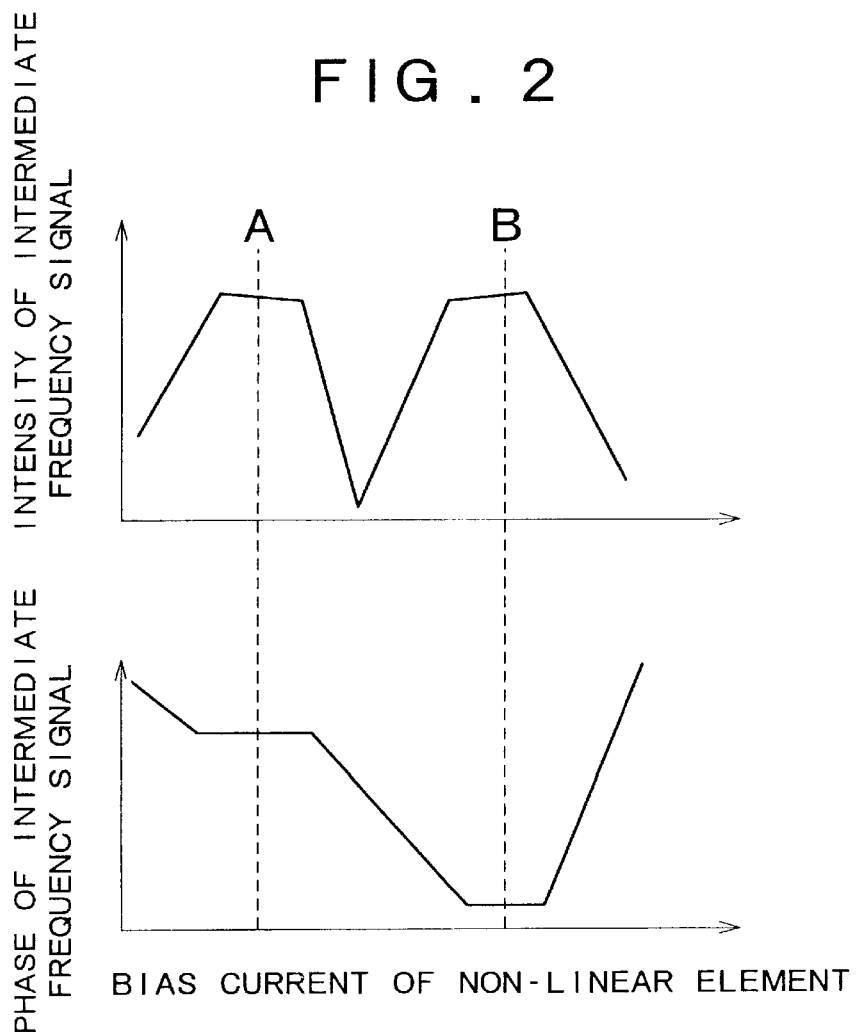
FIG. 2 is a graph showing a relationship between a bias current and a phase or an intensity of an intermediate frequency signal with taking the bias current of the non-linear element on the horizontal axis and the phase or the intensity of the intermediate frequency signal on the vertical axis.

It should be noted that, upon application for an electronic device, it is desirable to have little variation of amplitude of the intermediate frequency (IF) signal even among different phases. It is particularly preferred that the variation is less than or equal to 1 dB. FIG. 2 is a graph showing a relationship between a bias current and a phase or an intensity of an intermediate frequency signal with taking the bias current of the non-linear element on the horizontal axis and the phase or the intensity of the intermediate frequency signal on the vertical axis. In the shown embodiment, at points A and B of the bias current, the intensity of the intermediate frequency signal is high and substantially equal to each other. This represents that the amplitude of the intermediate frequency is large and substantially equal to each other. On the other hand, the phases are notably different from each other. Therefore, as the intensity of the intermediate frequency signal is substantially constant at points A and B of the bias current, the phase can be varied significantly. Therefore, the shown construction is suitable for an electronic device, such as a phased-array antenna or so forth. The variation of an amplitude of the intermediate frequency is preferable within 1 dB. When the variation of an amplitude of the intermediate frequency is slightly greater than 1 dB it may be reduced to be less than or equal to 1 dB, by varying the intensity of the local reference frequency wave (LO).

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A superconductor mixer comprising:

a substrate;

a thin film wiring of superconductor formed on said substrate; and a non-linear element having at least one series connected Josephson junction and formed on said substrate;

said thin film wiring including:
- an antenna pattern connected to said non-linear element and discharging and absorbing a high frequency electromagnetic field;
- an intermediate frequency output pattern connected to said non-linear element; and
- a phase control bias current supply pattern connected to said non-linear element and supplying a phase control bias current to said non-linear element.

2. A superconductor mixer as set forth in claim 1, wherein said series connected Josephson junction is a SNS junction, in which one normal conductor is disposed between two superconductors.

3. A superconductor mixer as set forth in claim 1, wherein a dimension of said non-linear element is smaller than a quarter of an effective wavelength of said high frequency electromagnetic field.

4. A semiconductor mixer as set forth in claim 1, wherein said thin film wiring is consisted of at least one kind of oxide superconductor selected from a group consisted of YBaCuO compound and NdBaCuO compound.

5. A superconductor mixer as set forth in claim 1, wherein said non-linear element is plural.

6. A phase control method of a superconductor mixer according to claim 1 comprising the steps of:

receiving a signal high frequency wave (RF) and a local reference frequency wave (LO) by said antenna pattern;

absorbing said signal high frequency wave (RF) and said local reference frequency wave (LO) in said non-linear element to obtain an intermediate frequency (IF) signal;

outputting said intermediate frequency (IF) signal as a frequency signal of a difference between said signal high frequency wave (RF) and said local reference frequency wave (LO) to said intermediate frequency output pattern; and varying a phase of said intermediate frequency (IF) signal by varying a current supplied from said phase control bias current supply pattern.

7. A phase control method for a superconductor mixer as set forth in claim 6, wherein variation of an amplitude of said intermediate frequency (IF) signal is less than or equal to 1 dB in said step of varying said phase of said intermediate frequency (IF) signal.

8. A phase control method for a superconductor mixer as set forth in claim 7, which further comprises a step of varying an intensity of said local reference frequency wave (LO) in conjunction therewith said step of varying said phase of said intermediate frequency (IF) signal.

* * * * *